United States Patent
Diez et al.

(10) Patent No.: US 10,989,778 B1
(45) Date of Patent: Apr. 27, 2021

(54) METHOD FOR MEASURING NMR-DATA OF A TARGET SAMPLE IN AN NMR SPECTROMETER AND NMR SPECTROMETER

(71) Applicant: Bruker France SAS, Wissembourg (FR)

(72) Inventors: Bruno Ezequiel Diez, Wissembourg (FR); Jorge Antonio Villanueva Garibay, Heidelberg (DE)

(*) Notice: Subject to any disclaimer, the term of this patent is extended or adjusted under 35 U.S.C. 154(b) by 0 days.

(21) Appl. No.: 17/126,268

(22) Filed: Dec. 18, 2020

(30) Foreign Application Priority Data

Dec. 20, 2019 (EP) .................................. 19315170

(51) Int. Cl.
*G01R 33/389* (2006.01)
*G01R 33/46* (2006.01)
*G01R 33/383* (2006.01)
*G01R 33/3875* (2006.01)

(52) U.S. Cl.
CPC ......... *G01R 33/389* (2013.01); *G01R 33/383* (2013.01); *G01R 33/3875* (2013.01); *G01R 33/4616* (2013.01)

(58) Field of Classification Search
CPC .................. G01R 33/389; G01R 33/4616; G01R 33/383; G01R 33/3875
See application file for complete search history.

(56) References Cited

U.S. PATENT DOCUMENTS

| | | | | |
|---|---|---|---|---|
| 3,873,909 A | * | 3/1975 | Ernst ...................... | G01R 33/46 324/312 |
| 4,864,241 A | * | 9/1989 | Goldie .................. | G01R 33/025 324/318 |

(Continued)

FOREIGN PATENT DOCUMENTS

CN 108761346 A 11/2018

OTHER PUBLICATIONS

Chen et al. "Field-frequency lock approach for 21.3-MHz high-performance NMR relaxation analyzer", AIP Advances 8, 075327 (2018).

(Continued)

*Primary Examiner* — Dixomara Vargas
(74) *Attorney, Agent, or Firm* — Benoit & Côté Inc.

(57) ABSTRACT

An NMR spectrometer includes a compensation system comprising at least one target sample coil and a lock sample coil positioned in a volume of interest between the main magnet poles of a main field magnet that generate a main magnetic field, at least one compensation coil for compensating a drift of the main magnetic field within the volume of interest, at least one target channel for generating RF-pulses with a target excitation frequency, and a lock data treatment system comprising a lock channel for generating RF-pulses with a lock excitation frequency, the lock data treatment system adapting a compensation current in the at least one compensation coil and correcting simultaneously the target frequency by applying a target frequency correction offset at the target channel. The spectrometer lock (Continued)

channel is improved, particularly for measurements where the lock coil and the target coil are positioned separately within the volume of interest.

13 Claims, 6 Drawing Sheets

(56) References Cited

U.S. PATENT DOCUMENTS

| | | | | |
|---|---|---|---|---|
| 4,965,521 | A * | 10/1990 | Egloff | G01R 33/56518 |
| | | | | 324/312 |
| 5,166,620 | A | 11/1992 | Panosh | |
| 5,297,033 | A * | 3/1994 | Bito | G01R 33/56545 |
| | | | | 324/309 |
| 6,873,153 | B2 * | 3/2005 | Frydman | G01N 24/08 |
| | | | | 324/307 |
| 7,271,588 | B2 * | 9/2007 | Frydman | G01N 24/08 |
| | | | | 324/309 |
| 9,507,004 | B2 * | 11/2016 | Campbell | G01N 24/10 |
| 10,101,423 | B2 * | 10/2018 | Devience | G01R 33/34092 |
| 10,159,413 | B2 * | 12/2018 | Shames | A61B 5/055 |
| 10,838,024 | B2 * | 11/2020 | Cochrane | G01R 33/091 |
| 2005/0007111 | A1 * | 1/2005 | Frydman | G01R 33/4616 |
| | | | | 324/307 |
| 2005/0134275 | A1 * | 6/2005 | Frydman | G01N 24/08 |
| | | | | 324/321 |
| 2006/0017441 | A1 | 1/2006 | Park et al. | |
| 2016/0041241 | A1 * | 2/2016 | Devience | G01R 33/4608 |
| | | | | 324/309 |
| 2018/0284206 | A1 | 10/2018 | Asano et al. | |
| 2018/0321333 | A1 * | 11/2018 | Cochrane | G01R 33/0035 |
| 2019/0072628 | A1 * | 3/2019 | Devience | G01R 33/4608 |

OTHER PUBLICATIONS

Masato Takahashi et al., "Towards a beyond 1 GHz solid-state nuclear magnetic resonance: External lock operation in an external current mode for a 500 MHz nuclear magnetic resonance", Review of Scientific Instruments 83, 105110 (2012).

* cited by examiner

METHOD FOR MEASURING NMR-DATA OF A TARGET SAMPLE IN AN NMR SPECTROMETER AND NMR SPECTROMETER

BACKGROUND OF THE INVENTION

Field of the Invention

The invention concerns a method for measuring NMR-data of a target sample in an NMR spectrometer with a main field magnet with main magnet poles for generating a main magnetic field ($H_0$), wherein the main magnetic field shows main magnet variations.

Description of the Related Art

An according method and spectrometer are known from Chen et al., Field-frequency lock approach for 21.3-MHz high-performance NMR relaxation analyzer," AIP Advances 8, 075327 (2018).

NMR magnets have a strong temperature dependency. There is a direct correlation between the main magnetic field generated by the main magnet and its frequency via the Larmor equation. Therefore, magnetic field variations caused for instance by temperature, field inhomogeneities, flowing current fluctuations, etc. would generate frequency changes. The temperature of the main magnet is controlled and regulated at its best accuracy by using the state-of-the-art electronics or any other cryogenic or similar technique. However, in permanent magnets temperature changes in the order of micro-kelvin ($10^{-6}$ K) are enough to lead to substantial frequency shifts of the NMR lines, because their field has a strong temperature dependency. This scenario would not cause big inconveniences if only one NMR signal acquisition would be recorded. Unfortunately, the main drawback of NMR is its lack of sensitivity when compared to other spectroscopy techniques. This means that, in general, signal-to-noise ratios (SNR) are rather small. The way to tackle this problem is by acquiring several times the same NMR signal; as a result, an averaged NMR signal is obtained. In addition, it is extremely important that every single resonance is recorded at its same frequency in order to avoid line broadening, lost resolution, and then again low SNR. Controlling the temperature of the main magnet is not sufficient to ensure the required frequency stabilities.

Another aspect that must be taken in account is magnet field inhomogeneity. Shim coils mounted along the magnet symmetry axes mitigate magnetic field inhomogeneities but leave residual field gradients that, in turn, generate frequency gradients.

In high-resolution NMR systems, the stability of magnetic field variations is achieved by locking a well-defined NMR signal, typically based on deuterium ($^2$H) nuclei. This requires that the sample to be analyzed has to be mixed with a deuterated solution. In this setup, both the lock sample and the sample under investigation (target sample) are in the same position within the given main magnetic field and thus see the same field distribution. In the case of permanent magnets, the mixing of the target sample with deuterium ($^2$H) nuclei is avoided by setting an external lock sample. Here, the target sample and the lock sample are sitting in different spatial positions within the main magnetic field. Therefore, the samples are exposed to different magnetic field distributions.

One approach to compensate for frequency differences between target sample and lock samples is the coil-less or frequency field lock (no compensation coil is needed). This approach requires a high magnetic field homogeneity around the target sample and lock samples in order to establish a frequency correlation between both. This is because an inhomogeneous magnetic field creates a rather complicated (sometimes impossible to model if the deviations are too large) frequency relationship between the lock sample and the target sample. Therefore, this approach can only be used in very limited scenarios. Its soft-lock counterpart is easier to be implemented since it does not require a compensation coil as well as an external lock sample. A workstation will process the first resonance peak transient to search for the strongest NMR resonance position, then for every subsequent resonance peak, this resonance is going to be set at the exact same frequency. However, neither the coil-less nor the soft-lock approach were implemented due to the presence of magnetic field inhomogeneities.

Patent document US 2018/0284206 discloses a lock method. The NMR probe-head comprises three ports encompassing high gamma and low gamma observation channels as well as a deuteron lock channel. The lock channel transmission and reception unit performs processes including frequency conversion and analog-to-digital (A/D) conversion on the input RF reception signals. The processed RF reception signals are temporarily stored in a reception memory as reception data. The reception data read from the reception memory are transmitted to the spectrometer control computer, which executes analysis of the reception data. Yet, this method only works well if both the lock sample and the target sample are located at the same magnetic field distribution.

Another example for a frequency field lock without a compensation coil system is disclosed in patent document U.S. Pat. No. 5,166,620. It provides an NMR locking mechanism with a phase locked loop that forms a locking mechanism that depends upon a variable frequency, i.e. the resonant frequency of the nuclei is compared to a variable frequency excitation that is adjusted to maintain a fixed offset frequency. Again, this method only works well if both the lock sample and the target sample are located at the same magnetic field distribution.

Patent document US 2006/0017441 describes an NMR apparatus provided with a lock device including a lock channel for correcting the lock current to a compensation coil for compensation of field inhomogeneities of the main magnetic field $H_0$. A lock detector performs detection of a signal and outputs a value to a lock corrector. The lock current source performs adjustment so that a current flowing through the compensation coil is proportional to said value. Therefore, the dependency of this lock excitation frequency shift to the corresponding lock coil current compensation is monotonic and can be proportionally corrected with a scaling factor. This is possible because the lock and the target samples are at the same magnetic field distribution and so their resonance frequency relationship is strictly proportional.

The methods known from the aforementioned patent documents only work well if both the lock sample and the target sample are located at the same magnetic field distribution. Thus, the lock sample cannot remain inside the main magnet independently of the target sample.

In patent document CN 108761346, which is related to US 2018/0284206, only FIDs are used to determine the corresponding relaxation constants. Therefore, high spectral resolution is not required. That means that the lock stability specifications are not as demanding as in the present invention.

In order to provide more flexibility and user friendliness concerning further sample preparation and lock-solvent dissolutions, it is known to have a lock sample which remains inside the main magnet together with the target sample. This however has the consequence that lock sample and target samples are not any longer in the same position within the magnetic field distribution and they do not share the same detecting coil. Therefore, the magnetic field distribution in both samples is not identical due to the field gradients. The lock channel works in the following way: it measures constantly the lock sample NMR signal and it determines its resonance frequency. Then, this frequency is compared with a predefined frequency. In order to get the said lock-sample resonance line always at the same position in the frequency scale, the lock channel determines the corresponding current for the $H_0$ compensation-coil. This current is delivered by a controlled power supply, which in turn, causes the compensation coil to change the magnetic field accordingly. In this way, the magnetic field variations can be compensated over time. Magnet inhomogeneity however will not be compensated.

Chen et al. (cited above) describes an according method of a low field NMR relaxometer. It comprises a field-frequency lock system with a $^{19}F$ lock sample in a micro coil integrated into the main probe as a lock detector, which is used to calculate the required main magnetic field compensation by compensation coils. Chen et al. discloses how the relationship between the frequency deviations in parts-per-million (ppm) is calculated with only two values between the lock sample and target sample for one specific coil compensation current value. This is a very simplistic approach to determine a compensation constant.

Due to the fact that the lock sample and target sample are not at the same position inside the NMR main magnet, the field corrections from the lock unit will result in different corrections on the target sample and the lock sample due to the magnetic field inhomogeneities. In addition, the compensation coil will generate itself a magnetic field gradient, which induces further magnetic fields inhomogeneities. These induced further inhomogeneities are therefore correlated to the compensation current flowing through the compensation coil. Thus, the higher the magnetic field variations, the higher the compensation current required, which in turn leads to larger field gradients. As a consequence, compensation of magnet field variations contributes to increase the offset frequency difference between the lock and that of the target sample. As a result, the target sample will deviate over time as this field gradient changes.

SUMMARY OF THE INVENTION

Brief Description of the Invention

The present invention provides a user-friendly method for measuring NMR-data with improved spectral resolution and a corresponding NMR spectrometer with an improved lock channel, in particular for measurements where the lock coil and the target coil are to be positioned at separate positions within the volume of interest, thus being placed in different magnetic field environments. This is achieved by a method and an NMR spectrometer described herein.

The inventive method comprises the following steps:
i) providing a transfer function, said transfer function correlating the frequency of the resonance peak of a lock sample (lock resonance frequency) and the frequency of the resonance peak of the target sample (target resonance frequency) at a present compensation current ($H_0$ compensation current) of at least one compensation coil, coefficients of said transfer function being stored in the lock data treatment system;
ii) measuring lock data by means of the lock sample coil;
iii) determining an actual required compensation current for compensating temporal changes of the main magnetic field, the compensation current being determined by processing the lock data of step ii);
iv) applying the compensation current to the at least one compensation coil;
v) determining a target frequency correction offset for the required compensation current by using the transfer function; and
vi) acquiring NMR-data of the target sample by exciting nuclei of the target sample by applying an RF-pulse by means of the target sample coil with a target excitation frequency corrected by the target frequency correction offset.

Preferably, the steps ii)-iv) (lock routine) will work all the time during the measurement and it runs independently of the target channel, i.e. steps ii)-iv) are preferably constantly repeated in a cycle and independently of whether or not there is an NMR acquisition in the target channel(s).

The inventive method takes into account magnetic field inhomogeneities as signal variations in the lock channel. These variations are frequency changes that the inventive method uses as input in order to obtain a reliable frequency compensation in the target channel. The invention will compensate for frequency deviations by knowing the actual compensation current that is supplied to the compensation coil. Thus, lock stability on permanent magnets are improved by correcting field drifts caused by the lock coil inhomogeneities.

The transfer function (frequency correction function) provided in step i) is a mathematical function that correlates the target frequency correction offset as a function of the compensation current. The transfer function is individual for the combination of the lock sample and the magnetic field distribution. The transfer function is preferably determined in a frequency mapping process prior to the actual data recording, which is used to create the NMR-spectrum. Both lock and target sample FID signals (lock data and target data), are used to determine the corresponding transfer function. Preferably, the transfer function determination is done once at the very beginning during the system setup or as required by the user.

In step ii) the lock data (NMR-signals from lock sample) is acquired by excitation of nuclei of the lock sample and detection of NMR-signal of the lock sample. The lock resonance frequency is determined from the lock data.

By comparing actual lock data with a reference time base a change of the main magnetic field can be observed, and the compensation current required to generate the nominal main magnetic field at the position of the lock sample can be calculated (step iii).

In step iv) main magnet field variations are compensated by applying the compensation current to the compensation coil.

In step v) the transfer function is used with the actual required compensation current (control signal) to determine the frequency offset that should be added to the observed data from the target sample. The target frequency correction offset is calculated from the coefficients of the transfer function and the control signal. The lock data treatment takes into account resonance frequency differences between the lock and the target samples via the transfer function obtained via the frequency mapping process.

The target frequency correction offset is preferably calculated after applying the compensation current to the compensation coil, but within the smallest time frame that is technically possible.

The inventive method corrects the target excitation frequency in step v) by applying the target frequency correction offset to the signal generator for generating RF-pulse for exciting target nuclei.

The main advantage of the inventive method is that there is a real connection between the lock data treatment unit which comprises the lock channel and which determines the compensation current to be applied to the compensation coil, and the FID acquisition unit of the target channel. The connection between the independently working target channel and lock channel allows on the fly corrections of the excitation frequency applied to the target sample.

The transfer function is preferably determined by acquiring a series of data points, each data point comprising lock data and target data, wherein for each data point the compensation coil current is modified and the lock resonance frequency and the target resonance frequency are recorded. The lock resonance frequency is the resonance frequency of lock sample measured by lock sample coil; the target resonance frequency is the resonance frequency of target sample measured by target sample coil.

The transfer function is preferably determined after booting the spectrometer and shimming the main magnet or after a request of a user.

During the frequency mapping process for determining the transfer function, both lock resonance frequencies and target resonance frequencies are recorded simultaneously. The lock sample coil records the lock resonance frequency, whereas the target sample coil records the target resonance frequency. The acquired data points are stored for further processing.

In a preferred variant for determining the transfer function, the range in which the compensation current is modified corresponds to the range of the main magnet variations (intrinsic variation of the main magnet).

In a further preferred variant for determining the transfer function, a difference between target resonance frequency and lock resonance frequency at a specific compensation current is determined for each data point. Thus, coefficients of the transfer function are determined via the frequency mapping process by determining the difference between the target resonance frequency and the lock resonance frequency as a function of the compensation current: The transfer function is determined by sweeping the lock coil by changing its current and both the resonance frequencies of the lock and the target samples will be measured at each sweep step. With the acquired NMR-data, an approximation function is calculated to determine the relationship between the compensation current and the frequency deviation between both measurements (target sample and lock sample). This approximation function is then used as transfer function. Thus, the transfer function is an approximation function for the relation between lock/target-frequency-difference and compensation current. This approximation function is used to calculate coefficients of the transfer function which are then stored in the transfer function unit of the lock data treatment unit.

In a highly preferred variant, the target resonance frequency and the lock resonance frequency are measured simultaneously. Simultaneously means within a period of less than 1 ms. In general, the target resonance frequency and the lock resonance frequency should be measured as close together in time as possible.

In a special variant, the transfer function is a polynomial, preferably a second order polynomial. In principle however, any other function may be used. The kind of transfer function to be used depends on the complexity of the correlation to be solved and it is not limited to a particular functional relationship. However, a polynomial development is preferred, as it requires fewer computing resources and it outputs a satisfactory correlation.

Preferably, in step iii) the compensation current is determined by comparing the lock resonance frequency determined from the lock data with a nominal lock resonance frequency. A reference time base can determine the nominal lock resonance frequency.

The inventive NMR spectrometer for carrying out the above-described method comprises a main field magnet with main magnet poles for generating a main magnetic field and a compensation system, the compensation system comprising:
  at least one target sample coil and a lock sample coil positioned in a volume of interest, the volume of interest being arranged between the main magnet poles;
  at least one compensation coil for compensating a drift of the main magnetic field within the volume of interest,
  at least one target channel for generating RF-pulses with a target excitation frequency, and
  a lock data treatment system comprising a lock channel for generating RF-pulses with a lock excitation frequency, wherein the lock data treatment system is configured to adapt a compensation current in the compensation coil and to correct simultaneously the target excitation frequency by applying a target frequency correction offset at the target channel.

The lock channel is adapted to generate an RF-pulse with the lock excitation frequency for exciting nuclei of a lock sample; the target channel is adapted to generate an RF-pulse with the target excitation frequency for exciting nuclei of a target sample. The lock channel and the target channel are independent from each other. Independent in this context means that the channels (lock channel and target channel) each comprise an emitter and a receiver, wherein these pairs of emitter/receiver do not influence each other; i.e. the emitter/receiver pairs are not linked by any kind of synchronized sequence. The only thing that is common to both the lock channel and the target channel is a common reference time base.

According to the invention, the lock channel has an effect on the target excitation frequency applied to the target sample by the target channel, i.e., the otherwise independent working lock channel influences the target excitation frequency.

The lock data treatment system is adapted to receive FID signals from the lock sample located within the volume of interest. The lock data treatment system is further adapted to determine the compensation current, to adjust the power supply for the compensation coil and to determine the target frequency correction offset to be added to the non-corrected target channel frequency. The target frequency correction offset is calculated via a lock data treatment unit for calculating the compensation current and transfer function coefficients provided with the lock channel.

With the inventive spectrometer, temporal magnet fluctuations can be compensated, and frequency offsets caused by field inhomogeneities induced by the compensation coil can be corrected.

The invention is particularly useful if the target sample coil and the lock sample coil are arranged at different positions within the volume of interest. Due to the different positions within the volume of interest, the target sample coil and the lock sample coil are exposed to different magnetic field distributions (main magnet variations). The magnetic field distribution depends first on the spatial homogeneity of the main magnetic field, i.e., the magnetic field gradient depends on the spatial distribution for a given time. As the time evolves, the distribution also changes. Therefore, the magnetic field distribution depends on its spatial homogeneity/inhomogeneity and the time. The inventive NMR spectrometer allows correcting such magnet variations.

In a highly preferred embodiment of the inventive spectrometer, a communication pathway is provided between the lock data treatment system and the target channel for transferring the target frequency correction offset from the lock data treatment system to the target channel. The lock data treatment unit receives and processes lock data. The lock data treatment unit comprises the lock channel with a lock signal generator for exciting the lock nucleus used to observe a change of a static magnetic field and a sequencer for controlling the excitation sequence applied to excite the lock nucleus. The lock data treatment unit further comprises a transfer function unit for storing transfer function coefficients, which are determined by a software routine.

It is particularly advantageous if the lock channel, the target channel and the communication pathway are arranged on a common embedded logic device. In this case, the lock routine and the FID acquisitions of the target sample can be performed in the same embedded logic device. This allows a real time connection that can be established between both channels. Other possibilities could include external compensations that however may not be real time and synchronized. Generally speaking, the higher the lock signal acquisition rate, the better the stability of the main magnet, because the lock channel will be able to correct for field variations more quickly, and thus it will perform better tracking of field variations. This can be achieved by finding the best compromise between lock signal acquisition rate and the time required to measure the lock nucleus signal that leads to the most accurate lock resonance frequency estimation. Since the compensation current flowing through the compensation coil will vary at the same speed as the field inhomogeneity is changing, it is highly preferred that the communication between the target channel and the lock channels operates at the same speed as the signal acquisition rate of the lock channel. Therefore, this communication is preferably in real time, which can be achieved by the aforementioned common embedded logic device. The embedded logic device can be based on FPGA, ASIC or CPU or a combination of FPGA, ASIC and CPU.

The main magnet can be a permanent magnet.

A compensation coil can be just a simple solenoid, a saddle coil or any other arrangement of coils. In a preferred embodiment, a pair of compensation coils is provided, e.g. a Helmholtz coil, i.e. a pair of coils (bobbins) whose radius is equal to the distance between the bobbins. Helmholtz coils are widely used because of its high homogeneity. In the present case, the Helmholtz coil is the best option for geometrical reasons and the way the magnetic field is oriented, besides the small distance between the poles of the main magnet.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

DETAILED DESCRIPTION

Figure 1:
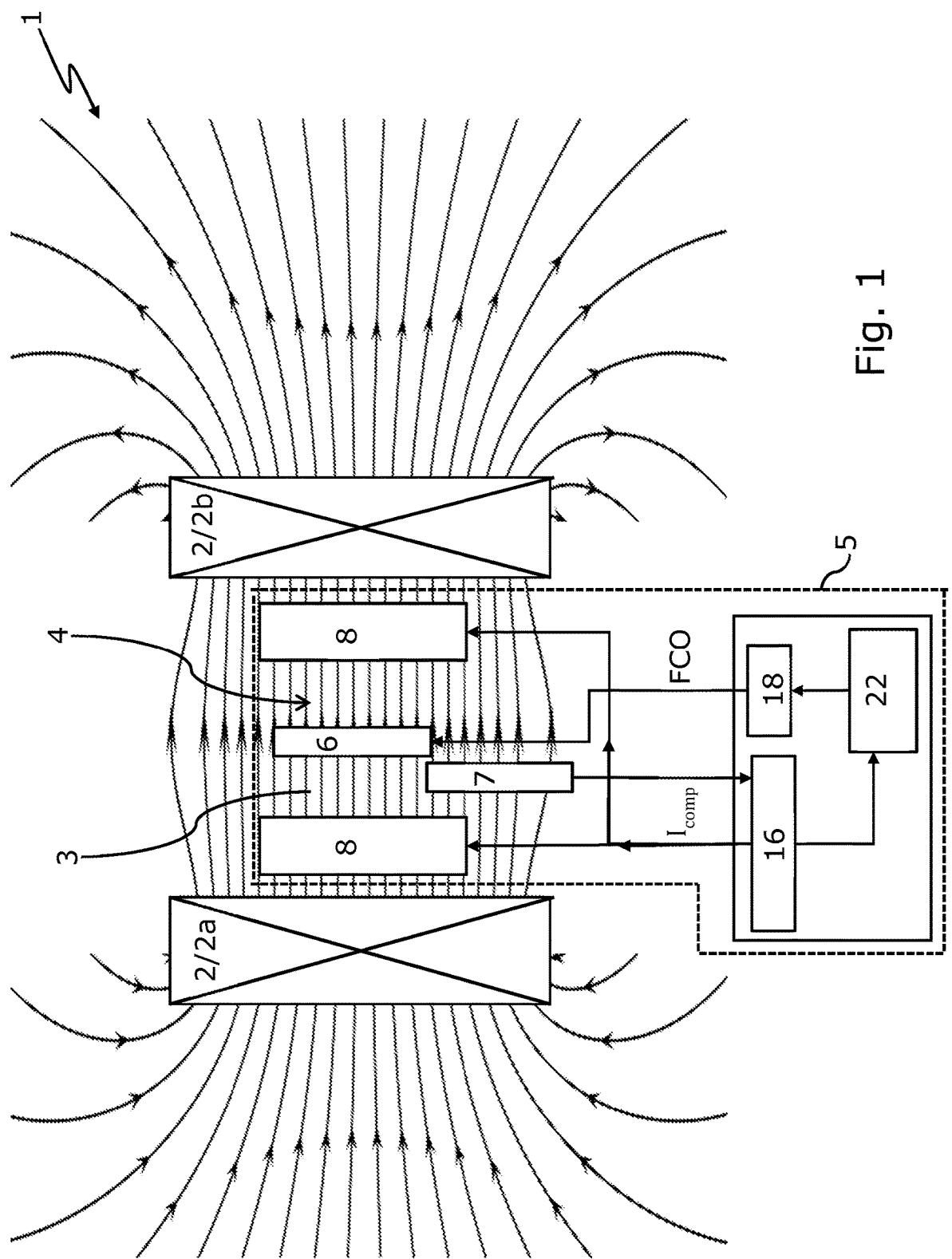
FIG. 1 shows a preferred assembly of the inventive NMR spectrometer.

FIG. 1 shows an NMR spectrometer 1 according to the present invention. The NMR spectrometer 1 comprises a main magnet 2 comprising two permanent magnets for generating a main magnetic field 3. In the example shown in FIG. 1 a permanent magnet is used as main magnet 2, but coil based magnets such as Helmholtz can also be used for generating the main magnetic field 3. A volume of interest 4 is located in an area where the main magnetic field 3 is as homogeneous as possible, i.e. between main magnet poles 2a, 2b of the main magnet 2.

The NMR spectrometer 1 further comprises a compensation system 5, which comprises a target sample coil 6, a target signal generator 18, a lock sample coil 7, compensation coils 8, a lock data treatment unit 16, and a transfer function unit 22 for storing coefficients of a transfer function TF. The two compensation coils 8 are positioned on either side of the target sample coil 6 and the lock sample coil 7 next to the coils of the main magnet 2.

The lock sample coil 7 and target sample coil 6 are geometrically separated within the volume of interest (air gap between the main magnet poles 2a, 2b). The magnetic field lines of the main magnetic field 3, which are illustrated schematically, show a different magnetic field environment for the target sample coil 6 and the lock sample coil 7.

Figure 2:
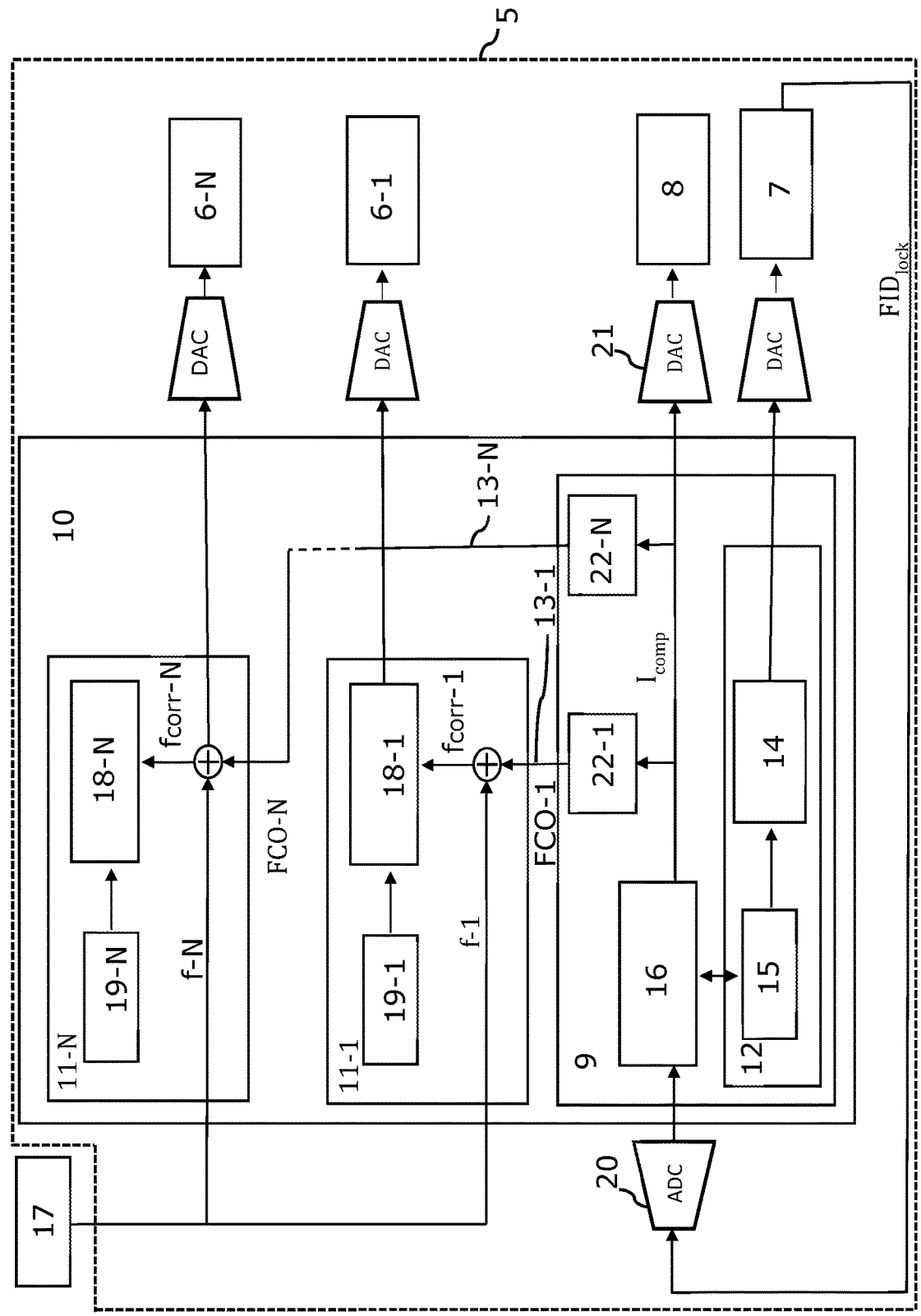
FIG. 2 shows an embodiment of a compensation system of the inventive NMR spectrometer with several target channels.

Compensation system 5 is shown in detail in FIG. 2. The compensation system 5 comprises from 1 to N target channels with at least one sample coil 6 if the nuclei have a similar Larmor frequency or, otherwise, several sample coils 6-1, 6-N, lock sample coil 7, compensation coil 8, N target channels 11-1, 11-N and the lock data treatment system 9. The components of the lock data treatment system 9 (lock channel 12, lock signal generator 14, lock pulse sequencer 15 and lock data treatment unit 16) and the target channels 11-1, 11-N are arranged on a common embedded logic 10. The lock channel 12 and the target channels 11-1, 11-N are running separately on the embedded logic device 10 and are connected via pathways 13-1, 13-N.

The lock data treatment system 9 is used for adjusting a power supply (not shown) for the compensation coil 8 by determining a compensation current $I_{comp}$ (control signal) as well as target frequency correction offsets FCO-1, FCO-N for target channel frequency correction. In the embodiment shown in FIG. 2 several target channels 11-1, 11-N are provided, in particular for different nuclei, e.g. $^1$H, $^{13}$C, $^{15}$N, $^{31}$P etc. The frequency correction adjustment works in the same manner for all nuclei.

A radio frequency (RF) pulse is generated with the lock signal generator 14 of the lock channel 12 to excite the lock nucleus of a lock sample (not shown) via the lock sample coil 7. As lock sample a fully fluorinated sample with a single NMR resonance can be used and thus the lock is done on $^{19}$F instead of $^2$H. However, this invention is not limited to any of these two nuclei and can be set to any other active NMR nucleus.

The lock nucleus is used for observing a change of the static main magnetic field 3. The sequencer 15 controls the sequence of the pulsing. The free induction decay (FID) signal (lock data $FID_{lock}$) of the lock sample is received and processed by the lock data treatment unit 16 to determine the corresponding correction for the compensation current $I_{comp}$ required for the compensation magnetic field which is applied by the compensation coils 8.

The compensation coils 8 will induce additional field inhomogeneities as function of the flowing compensation current $I_{comp}$. In order to correct this induced inhomogeneity, for each target channel 11-1, 11-N a transfer function is calculated by mapping the effect of different compensation current values with the frequency difference Δf between the frequencies measured in the respective target channel 6-1, 6-N and the lock channel 7. For this, the compensation current $I_{comp}$ sent to the compensation coils 8 is retrieved and evaluated in the transfer functions, thereby obtaining the frequency correction offsets FCO-1, FCO-N. The frequency correction offsets FCO-1, FCO-N are to be transferred via pathways 13-1, 13-N from the lock data treatment system 9 to the target channels 11-1, 11-N. The frequency correction offsets FCO-1, FCO-N are added in real time to target channel frequencies f-1, f-N set by a user 17 in order to obtain a corrected target excitation frequency $f_{corr1}$, $f_{corrN}$ for each target channel 6-1, 6-N. This corrected target excitation frequency $f_{corr1}$, $f_{corrN}$ will be sent to a target signal generator 18-1, 18-N, thus correcting the frequency of the target emitter path in real time. A target pulse sequencer 19-1, 19-N will control the target channel pulse routine. When a target channel acquisition is requested, a pulse with the corrected frequency is generated by target signal generator 18-1, 18-N (Direct Digital Synthesis sub-unit) and sent to the target sample coil 6-1, 6-N.

Figure 3:
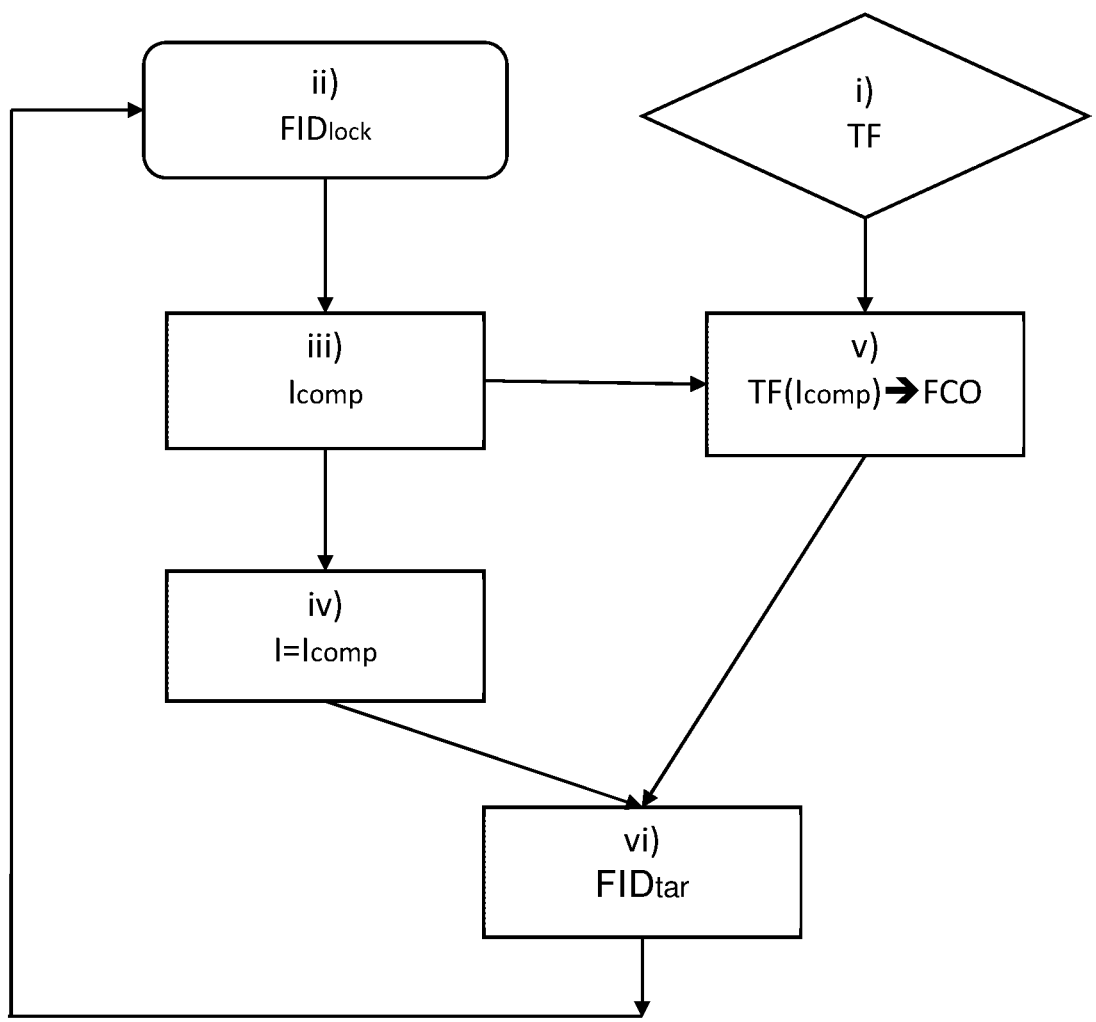
FIG. 3 shows the basic steps of the inventive method including lock routine and correction of the target excitation frequency.

FIG. 3 shows the basic steps of the inventive method including main magnet field compensation and correction of the target excitation frequency (lock routine) for one target channel 11.

In step i) a transfer function TF that describes the relationship between the compensation current and the frequency deviation between lock data $FID_{lock}$ and target data $FID_{tar}$ provided. The transfer function TF is a mathematical function, which correlates a target frequency correction offset FCO as a function of the compensation current $I_{comp}$ (or the resulting magnetic field offset), wherein the compensation current $I_{comp}$ is a function of the variations of the lock resonance frequency.

For calculating the compensation current $I_{comp}$, lock data $FID_{lock}$ is acquired by measuring FID data $FID_{lock}$ of a lock probe (step ii)). In step iii) lock data is processed and the compensation current $I_{comp}$ is determined. For this, the resonance frequency of the excited lock nucleus is determined by processing the lock data $FID_{lock}$. The lock data treatment unit 16 receives the lock data $FID_{lock}$ from the lock sample coil 7 through an analogue digital converter 20 (ADC) (see FIG. 2). The NMR lock signal can be decimated through a cascade integrator-comb filter (not shown) and a phase correction can be performed. A fast Fourier transform (FFT) of the down-sampled (decimated) lock data is applied to determine its resonance frequency. The dispersion component (imaginary part) of the FFT at the 0 Hz value is compared with a reference value (expected resonance frequency at a nominal main magnetic field). This compared value is fed to a proportional-integral-derivate controller (not shown), which will determine the compensation current $I_{comp}$ to be used by a controlled power supply (not shown) that feeds the compensation coils 8 through a digital analog converter 21 (DAC). However, other frequency estimation methods can be used to find the aforementioned resonance frequency, these well-known methods are, for instance, time domain based and rely on the zero crossing or the cancellation of the imaginary part of the FID NMR signal. The compensation current $I_{comp}$ that is required to change the main magnetic field in order to measure the lock resonance frequency according to the reference value is calculated and applied to the compensation coils 8 in order to change the magnetic field such that the resonance frequency corresponds to the reference value (step iv).

In step v) the frequency correction offset FCO is determined with the compensation current $I_{comp}$ and the transfer function coefficients. By adding the frequency correction offset FCO to the target channel frequency f set by the user 17, the corrected target excitation frequency $f_{corr}$ is obtained for acquiring NMR-data of the target sample in step vi).

Figure 4:
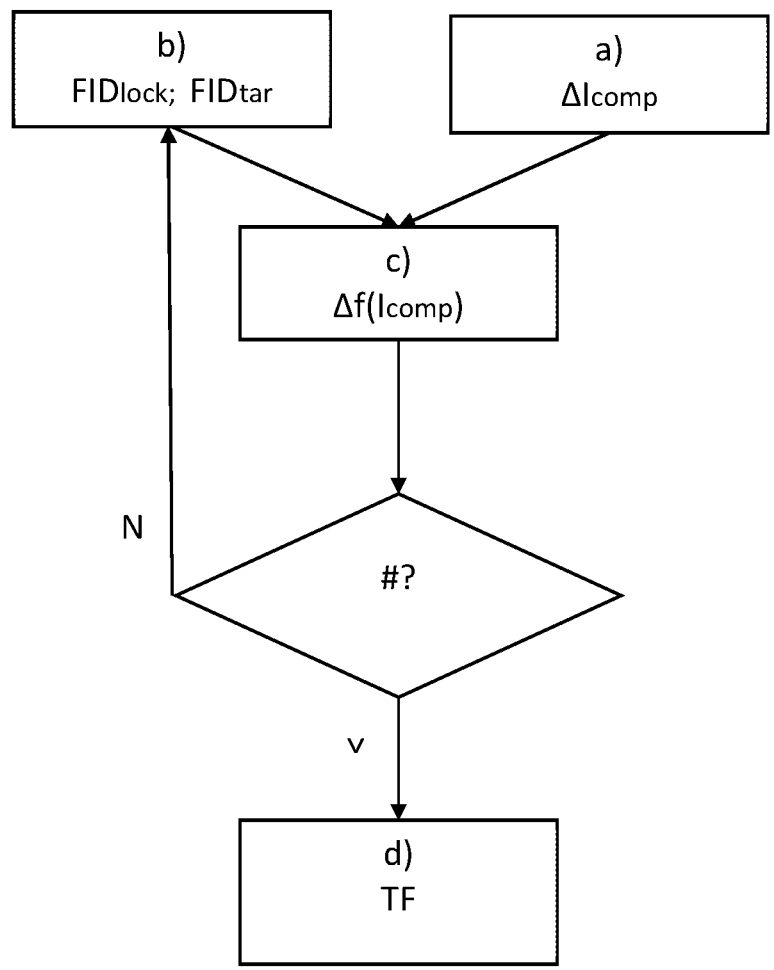
FIG. 4 shows a boot up routine for determining a transfer function.

FIG. 4 shows a boot up routine for determining the transfer function TF required for frequency correction.

In step a) after booting the spectrometer 1, or after a request by the user 17, the compensation current $I_{comp}$ is modified ($ΔI_{comp}$). Then, an NMR signal acquisition of target data $FID_{tar}$ and lock data $FID_{lock}$ is carried out (step b). The resonance frequency deviation Δf of the lock data $FID_{lock}$ and the target data $FID_{tar}$ is mapped as a function of the compensation current $I_{comp}$ (step c)). In this particular setup, it is sufficient to sweep the compensation current between −20% up to 20% of the maximal current output for the compensation coil 8. However, the frequency sweep range can be extended or reduced, depending upon the NMR main magnet 2 characteristics in order to cover the complete magnetic field drift caused by its temperature stabilization. For highly stable permanent main magnets with a limited frequency oscillation over time, the sweep range for the compensation coil 8 can be reduced to +/−10% whereas for relatively instable setups the sweep range should cover up to +/−35%. The compensation coil setup is the preferred approach, since by sweeping the frequency in this fashion it is possible to cover the complete main magnetic field variations. Therefore, by sweeping the compensation current $I_{comp}$ in the compensation coil 8 and simultaneously measuring the corresponding NMR resonances of the lock nuclei and the target nuclei in the closed period possible give access to map the frequency deviations Δf between lock data and target data within the sweep limits. It is advantageous to acquire simultaneously the NMR data of the said lock and said target nuclei (lock data $FID_{lock}$, and target data $FID_{tar}$) in order to have a most accurate frequency offset correlation at a given time.

The acquired NMR data $FID_{lock}$, $FID_{tar}$ are stored and steps b) and c) are repeated until a predefined number # of data points are measured. The predefined number # of data points is a compromise between accuracy and efficiency. As a rule, the higher the number # of data points the more accurate is the calculated transfer function TF. Conversely, the time for mapping the frequency deviations $\Delta f$ can be reduced by choosing fewer data points. The selection of the number # of data points strongly depends on the stability of the main magnet arrangement and it will differ from setup to setup. Hence, for a narrow sweep range, less data points for mapping are required and for a highly fluctuating magnet system, which requires a higher sweep range, more data points are needed to calculate a transfer function TF. In general, a range from 30 to 250 measured data points are sufficient to establish a transfer function.

Once the predefined number # of data points is reached, the transfer function TF is calculated (step d)). The transfer function or its coefficients is/are stored and can then be used for frequency correction as described above.

Figure 5:
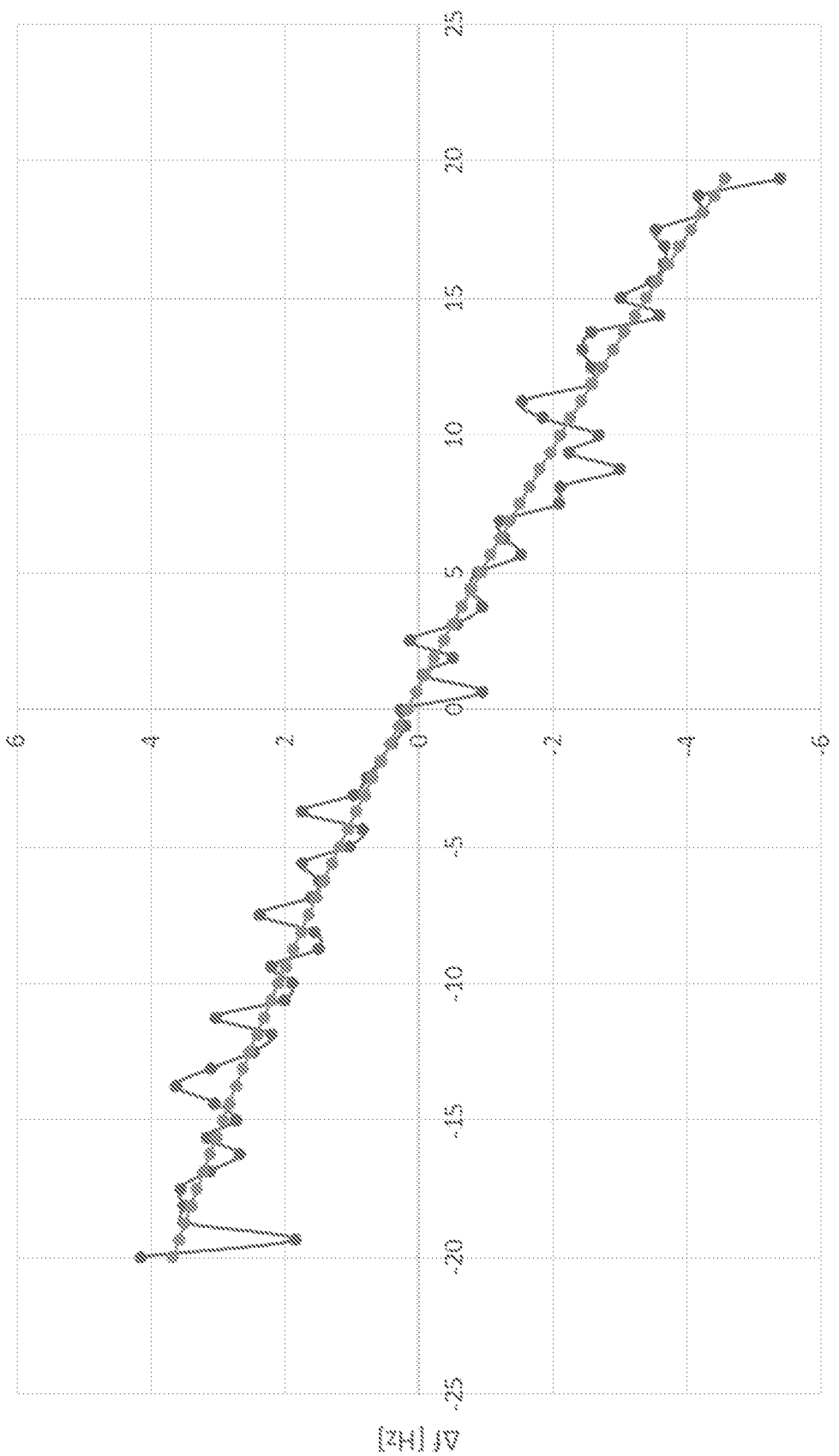
FIG. 5 shows a diagram showing the resonance frequency difference of target sample and lock sample in dependence of compensation coil current intensity without target frequency correction. A transfer function approximation is shown.
Figure 6:
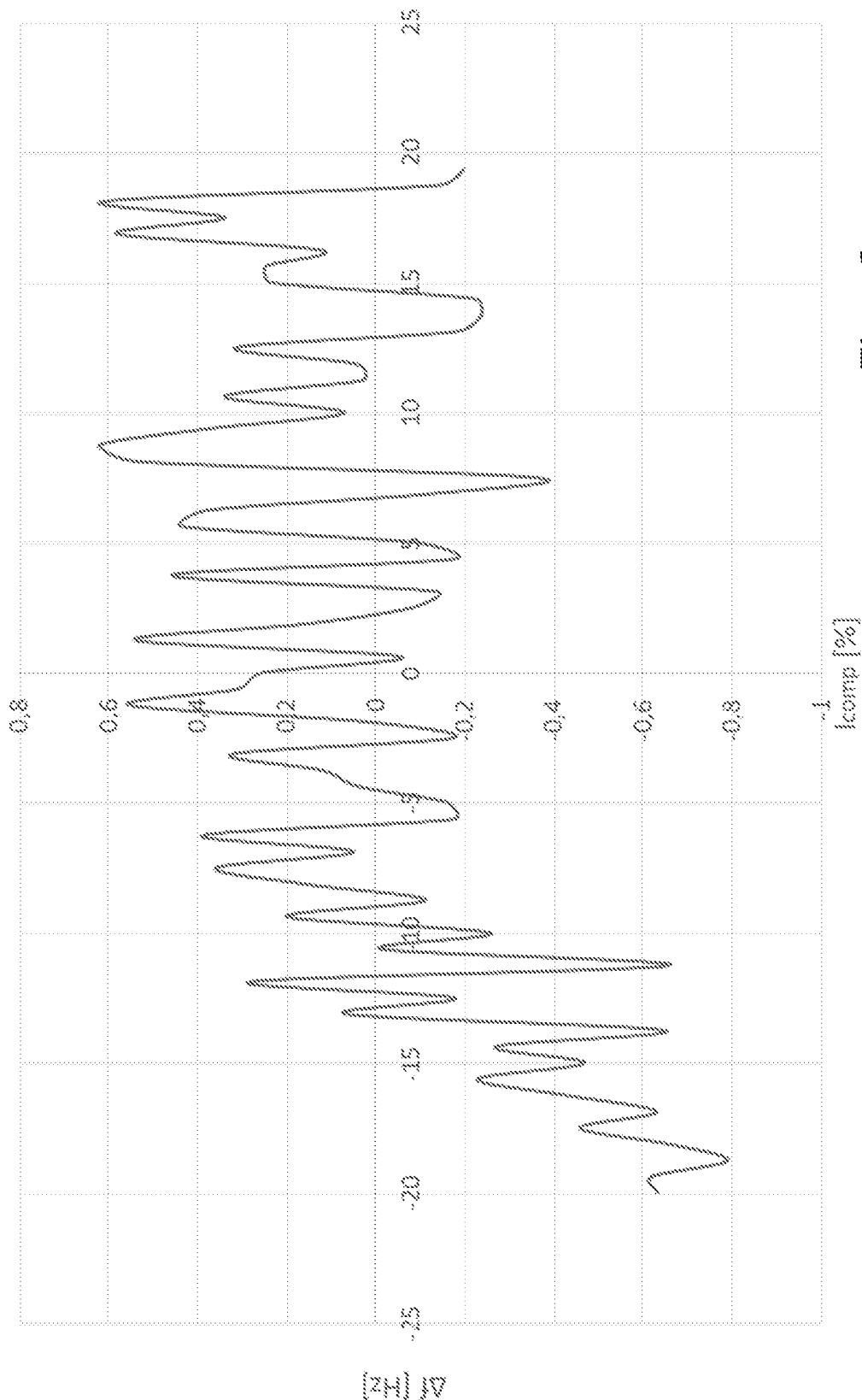
FIG. 6 shows a diagram showing the resonance frequency difference of target sample and lock sample in dependence of compensation coil current intensity with correction of the target excitation frequency.

A special variant to determine the transfer function TF is described with respect to FIGS. 5 and 6.

FIG. 5 shows the dependency of the frequency deviations of the compensation current $I_{comp}$. The frequency differences $\Delta f$ between the said lock and said target nuclei with respect to excitation frequency are calculated and then compared to each other. These frequencies are determined in ppm scale in order to eliminate the field dependency of the main magnetic field. In a perfect system without inhomogeneities, the frequency difference $\Delta f$ would be constant independent of the compensation current $I_{comp}$. However, current NMR systems in the described configuration show that there is a difference in the frequency deviations, as shown in FIG. 5.

To determine the transfer function, the lock data $FID_{lock}$ are preferably retrieved through the acquisition embedded logic whereas the target data $FID_{tar}$ are acquired with a workstation (not shown in the figures). In the workstation, the spectral width (SW) of the Fourier transformed target data as well as its number of points (NP) for the target nucleus, are retrieved. Hence, the resolution or dwell time (DW) in Hertz of the Fourier transformed target data is:

$$DW = \frac{SW}{NP} \quad (1)$$

For the lock data, its resolution or dwell time is determined with the acquisition frequency $f_{acq}$ and a decimation constant optimized in the used design by:

$$DW = \frac{f_{acq}}{Decimation * NP} \quad (2)$$

In order to compare the frequency variations of the target and lock nuclei, these frequencies are expressed in the absolute ppm scale. For a given magnetic field strength, the frequency of NMR active nuclei is scaled via the gyromagnetic ratios. The absolute frequencies of the target and lock nuclei are calculated by considering their resonance chemical shifts. The ratio of both emission frequencies is the following scaling factor K:

$$K = \frac{f_{lock}}{f_{target}} \quad (3)$$

Therefore, the correct target nucleus frequency can be calculated by the correction factor K and the corresponding frequency of the lock nucleus.

Using the workflow depicted in FIG. 4, data are acquired and temporally stored for both target and lock nuclei. The frequency differences $\Delta f$ are determined by mapping the magnetic field at the different sweeping selected values $I_{comp}$. Each frequency is determined in the following way by performing a FFT and then a phase correction, and then the dispersion part of the FFT is used to establish the position of the zero crossing. Next, the target nucleus frequency is multiplied by the correction factor.

As an example, in FIG. 5 the compensation-coil current $I_{comp}$ was set from −20% to 20% with a total of 64 sampling data points. The frequency difference curve is fitted using the mathematical operation that fits the best, in the given example a second order polynomial is used, but it is not limited to any specific function or polynomial order.

This workflow may be repeated several times in order to get as many as possible coefficients, which then will be averaged. The mean values provide the most accurate attainable coefficients due to its robustness. As an example, the data plotted in FIG. 5 were obtained with the polynomial coefficients as given by:

$$f(x) = c(0) + c(1) * CS + c(2) * CS^2 + \ldots + c(m) * CS^m$$

where $c(i)$ ($i=0, 1, 2, \ldots, m$) are the polynomial coefficients and CS is the control signal, which is the corresponding current percentage value that has been sent to the compensation coil via a controlled power supply.

The workflow for this fitting uses the x-axis data (control signal) to construct a Vandermonde matrix V with n+1 columns (where n is the order of the polynomial coefficient) and m rows equal to the number points, resulting in the following linear system:

$$\begin{pmatrix} x_1^n & x_1^{n-1} & \cdots & 1 \\ x_2^n & x_2^{n-1} & \cdots & 1 \\ \vdots & \vdots & \ddots & \vdots \\ x_m^n & x_m^{n-1} & \cdots & 1 \end{pmatrix} \begin{pmatrix} C(1) \\ C(2) \\ \vdots \\ C(m) \end{pmatrix} = \begin{pmatrix} y_1 \\ y_2 \\ \vdots \\ y_m \end{pmatrix}$$

Here $y_i$ ($i=0, 1, 2, \ldots, m$) is the frequency difference for the given control signal (current percentage). This linear equation is solved ensuring the least square error.

After applying the found coefficients from the Vandermonde matrix, and in order to illustrate its correction effect, new NMR data $FID_{lock}$, $FID_{tar}$ for both target and lock nuclei were acquired. The workflow is used once again to determine new frequency differences $\Delta f$. The results after the correction can be seen in FIG. 6. The frequency differences $\Delta f$ have been considerably reduced proving that the combination of a compensation coil $I_{comp}$ and the frequency correction offsets FCO is of great help in order to compensate for frequency shifts due to magnetic field inhomogeneities.

With the applied coefficients the traditional lock sequence is applied where the lock sample is measured periodically, lock data $FID_{lock}$ is treated and the compensation coil current $I_{comp}$ is updated. In addition, the target channel will be updated for each cycle through the frequency correction function TF, as shown in FIG. 3.

The implementation of the inventive method for frequency compensation in benchtop magnets has been proved. This methodology includes novel developments at the hardware level along with the software implementations to minimize parasitic magnetic field gradient distributions. It also helps to reduce the complexity of the compensation coil design that is required in such setups. Due to the given geometry, the lock-coil and the target-coil are set at different positions requiring that both must be at the best achievable magnetic field homogeneity. This is a rather complex task; without the aid of the inventive frequency compensation methodology, it would be almost impossible to achieve. The development of this concept is most efficient if both the lock channel and the target channel are implemented in the same embedded logic. Therefore, the communication and control among the necessary sub-units that are needed becomes optimally feasible. It is important to take into consideration that more independent designs on the same embedded logic can be realized because the density of a FPGA as embedded logic allows these connections. This allows independent systems to interact with each other straightforward.

Summarizing the invention, the value of the compensation current is used to compensate the frequency difference caused by the magnetic field inhomogeneities between the lock resonance frequency and that the target resonance frequency, i.e., in the lock channel, the corresponding control signal is used to drive a current source, which feeds the compensation coil, and one can add a frequency offset to consider the frequency difference of the target sample. The frequency offset is determined via a transfer function, the coefficients of which are provided with the lock data treatment system. Via a communication pathway, which connects the lock channel and the lock data treatment system the target frequency correction offset can be transferred from the lock channel to the corresponding target channel in order to correct an uncorrected frequency chosen by a user.

The invention claimed is:

1. A method for measuring NMR-data of a target sample in an NMR spectrometer comprising a main field magnet for generating a main magnetic field, wherein the main magnetic field shows main magnet variations, at least one compensation coil, at least one target sample coil, a lock sample coil, at least one target channel for generating RF-pulses with a target frequency and a lock data treatment system with a lock channel for generating RF-pulses with a lock excitation frequency and, the method comprising the following steps:
   i) providing a transfer function correlating a target resonance frequency of a resonance peak of the target sample and a lock resonance frequency of a resonance peak of a lock sample at a present compensation current $I_{comp}$ of the at least one compensation coil, coefficients of said transfer function being stored in the lock data treatment system;
   ii) measuring lock data $FID_{lock}$ by means of the lock sample coil;
   iii) determining an actual required compensation current $I_{comp}$ for compensating temporal changes of the main magnetic field, the compensation current $I_{comp}$ being determined by processing the lock data $FID_{lock}$ of step ii);
   iv) applying the compensation current $I_{comp}$ to the at least one compensation coil;
   v) determining a target frequency correction offset FCO for the required compensation current $I_{comp}$ by using the transfer function; and
   vi) acquiring NMR-data of the target sample by exciting nuclei of the target sample by applying an RF-pulse by means of the target sample coil with a target excitation frequency corrected by the target frequency correction offset FCO.

2. A method according to claim 1, wherein the transfer function is determined by acquiring a series of data points, each data point comprising lock data $FID_{lock}$ and target data $FID_{tar}$, whereas for each data point, the compensation current $I_{comp}$ is modified and the lock resonance frequency and the target resonance frequency are recorded.

3. A method according to claim 2, wherein a range in which the compensation current $I_{comp}$ is modified corresponds to a range of the main magnet variations.

4. A method according to claim 2, wherein a difference $\Delta f$ between the target resonance frequency and the lock resonance frequency at a specific compensation current $I_{comp}$ is determined for each data point.

5. A method according to claim 4, wherein the target resonance frequency and the lock resonance frequency are measured simultaneously.

6. A method according to claim 1, wherein the transfer function is a polynomial.

7. A method according to claim 1, wherein in step iii) the compensation current $I_{comp}$ is determined by comparing the lock resonance frequency determined from the lock data $FID_{lock}$ with a nominal lock resonance frequency.

8. An NMR spectrometer for carrying out the method of claim 1, the NMR spectrometer comprising a compensation system and a main field magnet with main magnet poles for generating a main magnetic field, the compensation system comprising:
   at least one target sample coil and a lock sample coil positioned in a volume of interest, the volume of interest being arranged between the main magnet poles,
   at least one compensation coil for compensating a drift of the main magnetic field within the volume of interest,
   at least one target channel for generating RF-pulses with a target excitation frequency, and
   a lock data treatment system comprising a lock channel for generating RF-pulses with a lock excitation frequency, wherein the lock data treatment system is configured to adapt a compensation current $I_{comp}$ in the at least one compensation coil and to correct simultaneously the target frequency by applying a target frequency correction offset FCO at the target channel.

9. An NMR spectrometer according to claim 8, wherein the target sample coil and the lock sample coil are arranged at different positions within the volume of interest.

10. An NMR spectrometer according to claim 8, wherein a communication pathway is provided between the lock data treatment system and each target channel for transferring the target frequency correction offset FCO from the lock data treatment system to the target channel.

11. An NMR spectrometer according to claim 10, wherein the lock channel, the target channel and the communication pathway are arranged on a common embedded logic device.

12. An NMR spectrometer according to claim 8, wherein the main magnet is a permanent magnet.

13. NMR spectrometer according to claim 8, wherein the at least one compensation coil is a pair of compensation coils.

* * * * *